United States Patent
Sinha et al.

(10) Patent No.: US 9,503,046 B2
(45) Date of Patent: Nov. 22, 2016

(54) MEMS DEVICES MADE WITH ISOTOPIC MATERIALS

(75) Inventors: Rajarishi Sinha, Pittsburgh, PA (US); David Francois Guillou, Pittsburgh, PA (US)

(73) Assignee: Cymatics Laboratories Corp., Pittsburgh, PA (US)

( * ) Notice: Subject to any disclaimer, the term of this patent is extended or adjusted under 35 U.S.C. 154(b) by 669 days.

(21) Appl. No.: 13/492,075

(22) Filed: Jun. 8, 2012

(65) Prior Publication Data

US 2012/0313480 A1 Dec. 13, 2012

Related U.S. Application Data

(60) Provisional application No. 61/495,068, filed on Jun. 9, 2011.

(51) Int. Cl.
| | |
|---|---|
| *H03H 9/13* | (2006.01) |
| *H03H 9/17* | (2006.01) |
| *H03H 9/02* | (2006.01) |
| *H01L 41/09* | (2006.01) |

(52) U.S. Cl.
CPC ......... *H03H 9/172* (2013.01); *H03H 9/02015* (2013.01); *H03H 9/173* (2013.01); *H01L 41/094* (2013.01); *H03H 9/13* (2013.01)

(58) Field of Classification Search
CPC .. H03H 9/02015; H03H 9/173; H03H 9/172; H03H 9/13; H01L 41/094
USPC .................................................. 310/300, 309
See application file for complete search history.

(56) References Cited

U.S. PATENT DOCUMENTS

| | | | |
|---|---|---|---|
| 5,442,191 A | 8/1995 | Ma | |
| 6,392,220 B1* | 5/2002 | Slater | B81B 3/0051 250/216 |
| 7,119,400 B2* | 10/2006 | Burden | C30B 23/02 257/347 |
| 8,339,013 B2* | 12/2012 | Miyazaki | H02N 1/006 200/181 |
| 2003/0039865 A1* | 2/2003 | Kelsey | C03C 3/06 428/696 |
| 2004/0227202 A1* | 11/2004 | Pesavento | 257/416 |
| 2007/0181411 A1* | 8/2007 | Ikehashi | H01H 59/0009 200/181 |

OTHER PUBLICATIONS

International Search Report and Written Opinion, PCT/US2012/041606, dated Jan. 29, 2013.

* cited by examiner

*Primary Examiner* — Dang Le
*Assistant Examiner* — Leda Pham
(74) *Attorney, Agent, or Firm* — Lerner, David, Littenberg, Krumholz & Mentlik, LLP

(57) ABSTRACT

A MEMS or NEMS device with at least one component made of a non-naturally occurring isotope material. The refined isotopic material provides advantages to device operation such as reduced mechanical loss, increased breakdown voltage, improved tunability and other advantages.

14 Claims, 9 Drawing Sheets

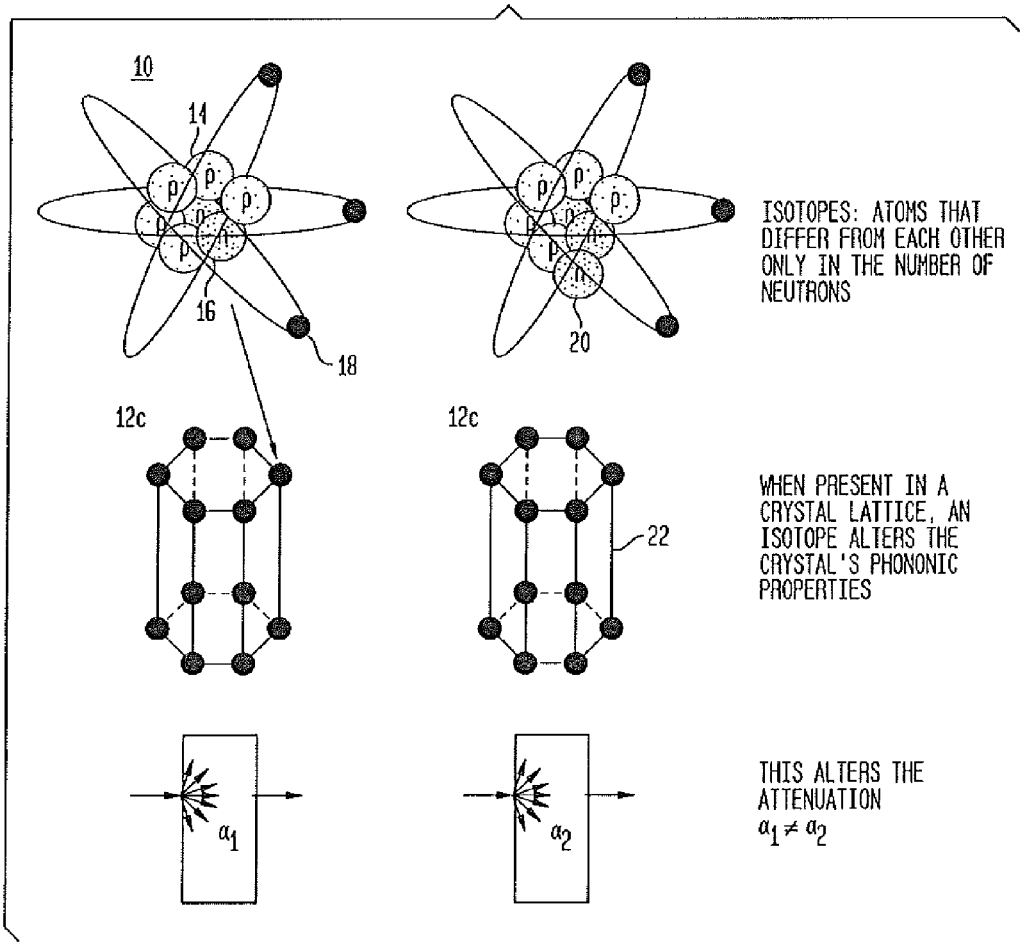

LINE WIDTHS FOR DIFFERENT ISOTOPIC COMPOSITION

MASS/SPRING/DAMPER MODEL

BVD MODEL

TRANSMISSION LINE MODEL

MEMS INERTIAL CANTILEVER

MEMS BAW RESONATOR

MEMS BAW RESONATOR-PERFORMANCE COMPARISON-FULL BAND

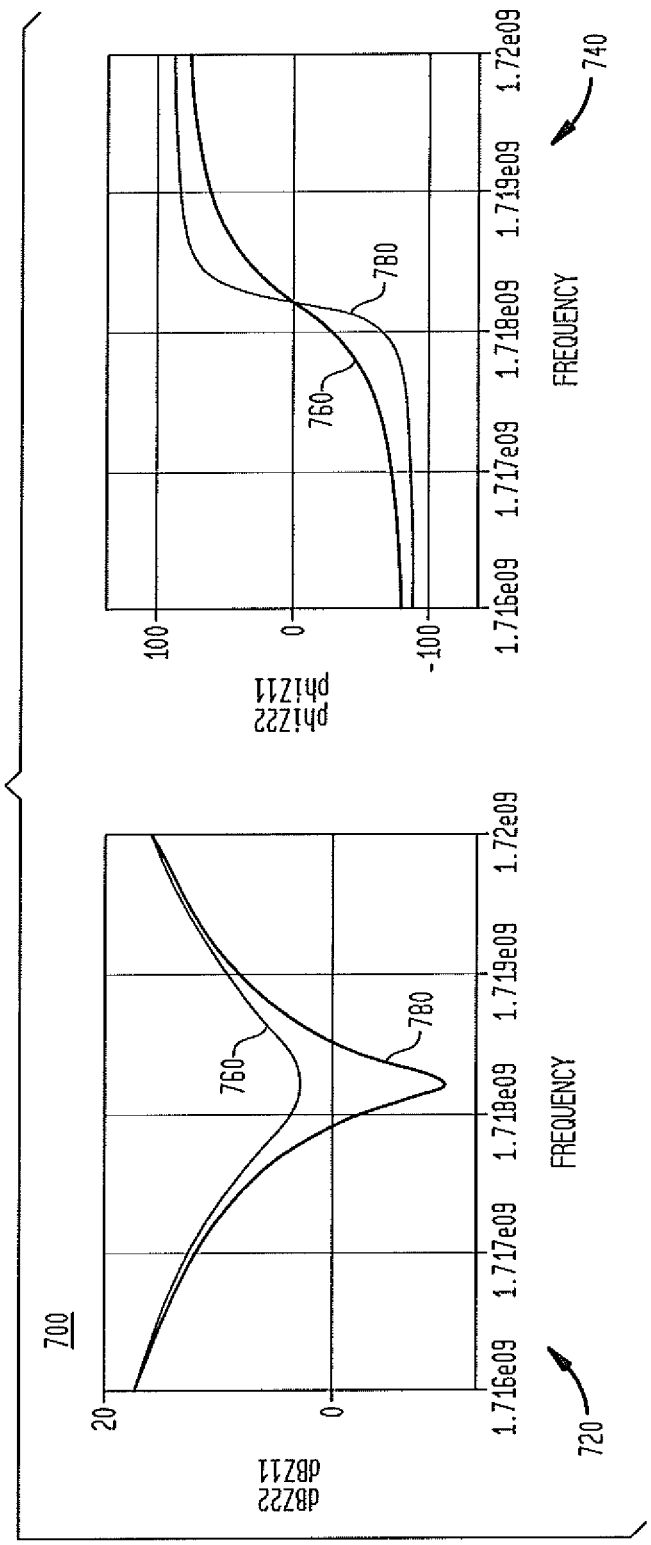

MEMS DEVICES MADE WITH ISOTOPIC MATERIALS

CROSS REFERENCE TO RELATED APPLICATIONS

The present application claims the benefit of the filing date of U.S. Provisional Patent Application No. 61/495,068 filed Jun. 9, 2011, the disclosure of which is hereby incorporated herein by reference.

FIELD OF THE INVENTION

The present invention relates to MEMS devices manufactured with thin film processing techniques and, more particularly, to the nature of the materials used to make MEMS devices.

BACKGROUND OF THE INVENTION

Many MEMS (Micro-Electro-Mechanical Systems), NEMS (Nano-Electro-Mechanical Systems) and nano devices implement their function by transferring, modulating or transducing mechanical energy. In the process of transfer, modulation and/or transduction of mechanical energy, some energy is dissipated. Such energy dissipation is a consequence of the First and Second Laws of Thermodynamics.

For example, a MEMS cantilever is the simplest embodiment of a MEMS inertial device. The cantilever is set into motion by an external impulse, such as an external inertial force, or through electrostatic coupling. The energy dissipation is quantified by a metric called the attenuation coefficient. When the mechanical response of the cantilever in such devices is a mass-spring-damper system, the energy dissipation term corresponds to the damper in the system.

Another example of a MEMS device that transfers mechanical energy is a MEMS bulk acoustic wave (BAW) resonator. Such resonators are realized in suspended (Film Bulk Acoustic Resonator—FBAR) and solidly mounted (Solidly Mounted Resonator—SMR) configurations.

A metric of energy dissipation in resonating or vibrating devices is the quality factor Q, which is expressed as a ratio of the energy stored to the energy dissipated per cycle:

$$Q = \text{Energy stored/Energy dissipated per cycle} \qquad (1).$$

Both configurations consist of charge collecting electrodes coupled to a piezoelectric transducer. The transducer, usually a piezoelectric layer (but can also be an electrostatic transducer), converts an applied AC electrical stimulus to an AC mechanical strain. The mechanical strain propagates through the device, and is reflected at the boundaries of the device. The "boundary" is a mechanical impedance discontinuity, such as the electrode-air interface in the case of the FBAR, or the electrode-bragg interface in the case of the SMR. This sets up a standing wave within the resonator, which can be represented by a model known as the BVD model. The BVD model is analogous to the spring-mass-damper model used for the inertial cantilever, with an additional parallel capacitance representing the dielectric of the transducer. As before, the damper represents the energy dissipated in the device.

Inertial MEMS structures and BAW resonators have been extensively studied and manufactured. Such structures are formed by patterning the structure in a substrate and releasing the structure therefrom using semiconductor processing techniques.

Such devices have had widespread commercial use. For example, silicon, polysilicon and diamond-based resonators have made it into a multitude of inertial MEMS based sensors manufactured by companies like ST Microelectronics, Bosch, Analog Devices, Invensense, Virtus Advanced Sensors, SiTime, Discera, Sand9 and others. These sensors are found in a wide array of products such as acceleration sensors, gyros, shock sensors, oscillators, chemical and biological sensors, etc.

BAW devices are described in Rosenbaum, T., "RF Bulk Acoustic Wave Filters for Communications" (Artech House, Publ. $1^{st}$ Ed., May 31, 2009). Quartz-based BAW resonators have been manufactured for many years and more recently piezoelectric materials such as Aluminum Nitride (AlN) and Zinc Oxide (ZnO) have been extensively studied and commercialized in BAW devices. Tunable materials such as Strontium Titanate (STO), Barium Strontium Titanate (BST) and other incipient ferroelectrics (disclosed in commonly owned patent application U.S. Ser. No. 12/391,490), which is incorporated by reference herein, are being examined to complement the functionality of AlN or ZnO in a BAW resonator. AlN-based BAW resonators have been used in RF filter and power amplifier products.

BAW resonators are also being investigated as a frequency reference for oscillators as described in Hashimoto, K. Y., "RF Bulk Acoustic Wave Filters for Communication," (Artech House Publ. $1^{st}$ Ed., May 31, 2009). The BAW resonator provides a large change in impedance (magnitude, phase, or both) over a frequency range. A wide range of oscillator architectures can be implemented around such a resonator. However, in all instances, the oscillator performance is enhanced by a high quality (Q) factor resonator.

In MEMS design, one objective is to reduce the dissipated energy as much as possible. This provides a commensurate reduction in operating power, and device lifetime is increased and the desired product performance metrics are more readily achieved. A reduction in dissipated energy can be achieved by improving materials and processes or by improving device geometry. However, although some reduction in dissipation of energy in MEMS devices has been achieved by improving materials and processes, further improvement continues to be pursued.

SUMMARY OF THE INVENTION

Described herein are devices that deploy a non-naturally occurring isotopic material that has been refined to have an altered isotopic dominance. The non-naturally occurring isotopic material cooperates with other device components to provide a desired device response. In one embodiment the device is a micro-electro-mechanical system (MEMS) device or a nano-electro-mechanical system (NEMS) device. The device is provided on a supporting substrate. A transducer element is formed over the substrate. The device is further formed of a conductor and an insulator defining conductive regions of the device. The conductor and transducer element cooperate to provide a device response. The isotopic material provides reduced mechanical loss to the MEMS device as compared to a device that does not have the isotopic material.

BRIEF DESCRIPTION OF THE DRAWINGS

FIG. 1A is a symbol view of an isotope 18 effect;

FIG. 7 is a scaled view of the comparison in FIG. 6.

DETAILED DESCRIPTION

Figure 1B:
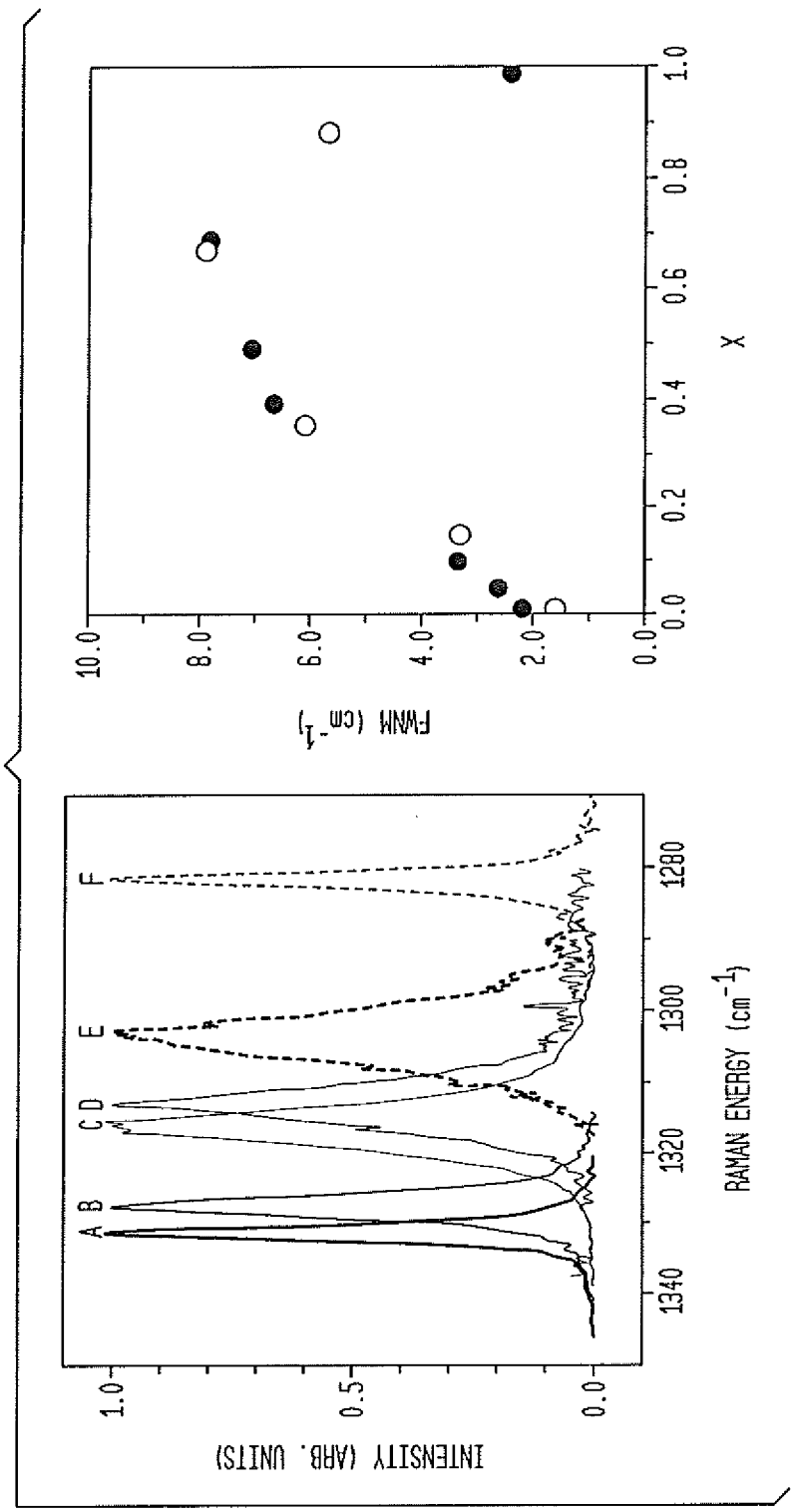
FIG. 1B is a plot view of a first-order Raman spectra of diamond.

Most methods of manufacturing MEMS devices involve semiconductor process steps that deposit, mask and etch layer of materials, such methods generally, are well known to one skilled in the art and not discussed in detail herein. Further discussion of processes will assume general knowledge of these methods, with the understanding that they can be generalized to other, emerging MEMS and nanodevice manufacturing techniques such as self-assembly, growth of single- and multiwalled-walled nanotubes; etc.

Improvement in materials and processes comes from new material deposition techniques that deposit the material on the substrate in a particular crystallographic orientation. Such orientation is achieved by the deposition, and can be in combination with specialized material layers underneath. Many such methods exist, and several are summarized in Maluf, N., et al., "An Introduction to Micro-electro-mechanical Systems Engineering" (Artech House Publ., $2^{nd}$ Ed., June 2004) and Hashimoto, K. Y. et al., "RF Bulk Acoustic Wave Filters for Communications," (Artech House, Publ., $1^{st}$ Ed., May 31, 2009), which are hereby incorporated by reference.

Improvements in device geometry that yield improved device performance include altering the shape and layout of each device layer as well as the thickness of each device layer. Many methods exist, and several are described in Hashimoto, K. Y., et al. above.

In semiconductor materials, isotopic materials have been used to improve carrier mobility and power handling in transistors. For example, see U.S. Pat. Nos. 5,144,409 and 5,442,191, which issued on Sep. 1, 1992 and Aug. 15, 1995 respectively and are incorporated by reference herein. U.S Patent Application Publication No. 2004/0227202 filed on Nov. 21, 2003 describes the use of isotopically enriched quartz in the context of transistor devices. Several other applications of the isotope effect have been described, including neutron transmittive doping, optical fibers, and lasers. Some researchers have also suggested applications for the use of the isotope effect in information storage and quantum computers.

Most naturally occurring materials used in the manufacture of MEMS, NEMS and nanomechanical devices are of mixed isotopic composition. The stable isotopes of the constituent atoms are present in a fixed proportion. For example, silicon occurs in the composition 28Si (92.2%), 29Si (4.6%) and 30Si (3.0%), with 0.2% being other negligible contributions. The material is deposited on the substrate via a variety of methods such as chemical vapor deposition (CVD) and its variants; RF sputtering from a target; and atomic layer deposition (ALD).

The isotope effect is a physical phenomenon where replacement of atoms in the crystal lattice by their isotopes results in a change in the physical properties of the lattice. In particular, the mass, lattice constants and dissipation constants are altered by the change in isotopic composition. An important example is the strong isotope effect on the superconducting transition temperature that has indicated that phonons are important in BCS superconductivity.

As described herein, the isotope effect is used to reduce the attenuation constants of materials used in the manufacture of MEMS devices, nanoelectrical mechanical systems (NEMS) and nanomechanical devices. More specifically, the isotopic effect is used to alter certain properties of materials to improve the performance of devices in which those materials are incorporated.

Phonon frequency in isotopes is affected by changes in the mass of the crystal. The processes that cause these changes can be broadly classified into two classes according to Lockwood et al. "Light Scattering in Semiconductor Structures and Super Lattices," pp. 132 (NATO Science Series B: Physics; Springer, $1^{st}$ Ed., Jan. 31, 1992); and Plekhanov, v., "Applications of the Isotopic Effect in Solids" (Springer Series in Materials Science; $1^{st}$ Ed., Aug. 26, 2004), which is incorporated by reference herein. These classes are anharmonic interactions and elastic scattering. The former are due to higher order terms in the expansion of the lattice potential. The latter are due to wave-vector conservation in isotopically mixed and/or disordered samples. In isotopically pure samples, the elastic scattering processes are largely absent, so one would expect the corresponding samples to have lower phonon dissipation.

Anharmonic interaction processes are determined largely by the isotope mass. As described in Cordona, M., "Isotopic Effects in the Phonon and Electron Dispersion Relations of Crystals," Phys. Stat. 501., Vol. 220, No. 5 (2000), which is hereby incorporated by reference, in an isotopically pure crystal, the frequency w of a phonon corresponding to wavevector k and branch j is:

$$w=\sqrt{(f(k,j)/M)} \quad (2)$$

where f(k,j) is a restoring force constant and M is the isotopic mass. According to equation (2) crystals of isotopes of lower mass possess higher frequency phonons. According to Cordona, the higher the phonon frequency, in general the lower the dissipation. One skilled in the art is aware that exceptions to this relationship exist.

Scattering spectra are very useful tools to characterize the properties of materials. Such techniques are described in Lockwood et al., and Pelletier, M. J., Analytical Applications of Raman Spectroscopy, (Blackwell Publ., May 11, 1999). Pelletier is also hereby incorporated by reference. For example, for an isotopically mixed sample of silicon, peaks in the intensity occur for each phonon interaction. These intensity peaks correspond to particular isotope atoms in the crystal. The energy shifts between peaks is related to the isotopic mass of each peak. For example, with reference to Manzowa, H., et al., "Disorder Effects of Nitrogen Impurities, Irradiation—Induced Defects, and 13C Isotope Composition on the Raman Spectrum in Synthetic Ib Diamond," Phys. Review B, Vol. 54, No. 6 (Aug. 1, 1996) which is hereby incorporated by reference, six isotopically mixed compositions of diamond were examined. These compositions were formed by growing diamond crystals using both 12C and 13C isotopes of carbon. Referring to FIG. 1B of Manzowa et al. (reproduced as FIG. 1B herein), there are six peaks corresponding to each of the six compositions A through F. The spacing between peaks is described as related to the different reduced mass of each peak according to Manzowa et al.

The line width is a property of the Raman spectra of a crystal. Raman spectroscopy is described in Pelletier described above. The line width characterizes the width of a spectral line. The width is reported as the Full Width Height Maximum (FWHM) of the line and has dimensions of $L^{-1}$. Narrower or smaller line widths indicate lower phonon scattering.

The line width is related to the attenuation in the crystal according to Lockwood et al. This has been shown in the literature for diamond according to N V Surovtsev, N. V., et al., "Effect of nitrogen impurities on the Raman line width in diamonds", J. Phys.: Condens. Matter Vol. 11, pp. 4767-4774 (1999); Inyushkina, A. V., et al., "Considerable Increase in Thermal Conductivity of a Polycrystalline CVD Diamond upon Isotope Enrichment", Bul. Lebedev Phys. Inst., Vol. 34, No. 11, pp. 329-333, (2007); and which are hereby incorporated by reference, and for Ge and Si as described in Kuleev, I. G., et al., "Anisotropic Attenuation of Transverse Ultrasound in Cubic Crystals of Ge, Si, and Diamond with Various Isotopic Compositions", Phys. Solid State, Vol. 49, No. 9, pp. 1643-1651 (2007), which is hereby incorporated by reference, and for silica porous systems as described in Caponi, S. et al., "Acoustic attenuation in silica porous systems", J. Non-Crystalline Solids, Vol. 322, pp. 29-34 (2003). Similar results have been obtained for other systems.

The line width $\Delta w$ can be related to the attenuation as:

$$\Delta w = 2\alpha v \quad (3)$$

where $\alpha$ is the attenuation coefficient and v is the acoustic velocity. This relationship is described in Lockwood et al. Non-linear relationships between $\alpha$ and $\Delta w$ have also been reported. In all cases, however, an increase in $\alpha$ is accompanied by an increase in the line width $\Delta w$.

Naturally occurring isotopic mixtures have point defects in the crystal structure, because the lattice contains atoms of all the naturally occurring isotopic variations. This results in an increase in the line width of the Raman spectra for the crystal, due to increased elastic scattering. For example, it has been reported that diamond has a line width that has a non-monotonic relationship with isotopic composition. The isotopically purest samples exhibited the lowest line widths, with a maximum in the line width occurring for an isotopically mixed sample. FIG. 1B shows the results obtained by Hanzawa et al. (Hanzawa, H., et al., "Disorder effects of nitrogen impurities, irradiation-induced defects, and 13C isotope composition on the Raman spectrum in synthetic Ib diamond", Physical Review B (Condensed Matter), Vol. 54(6) pp.3793-3799 (Aug. 1, 1996), which is hereby incorporated by reference). For six different isotopic compositions of diamond varying from nearly pure 12C to nearly pure 13C, labeled A through F, the FWHM of the line width of the spectra varies from around 2.0 $cm^{-1}$ for the purest compositions, to 8.0 $cm^{-1}$ for the mixed samples.

Another important feature is the effect of anharmonic interactions. Hanzawa et al. also report that the line width of the isotopically pure composition consisting of the lightest isotope (12C) was slightly smaller than the corresponding line width of the isotopically pure composition of 13C (the heaviest isotope). This small difference arises from the previously described class of anharmonic interactions. These dissipative processes are due to higher order terms in the expansion of the lattice potential.

Therefore, according to the embodiments described herein, non-naturally occurring isotopically enriched materials are used in the manufacture of MEMS, NEMS and nanomechanical devices. The benefits are two-fold. First, an isotopically "refined" material will have far fewer point defects in the crystal structure. Second, if the crystal lattice consists of the lighter isotopes of the element, the line width is smaller (as there are fewer point defects) than if the lattice were constructed out of the heavier isotopes of the element as illustrated in FIG. 1B. Both mechanisms are exploited to achieve the highest possible Q factor for the device made using such materials.

Figure 2:
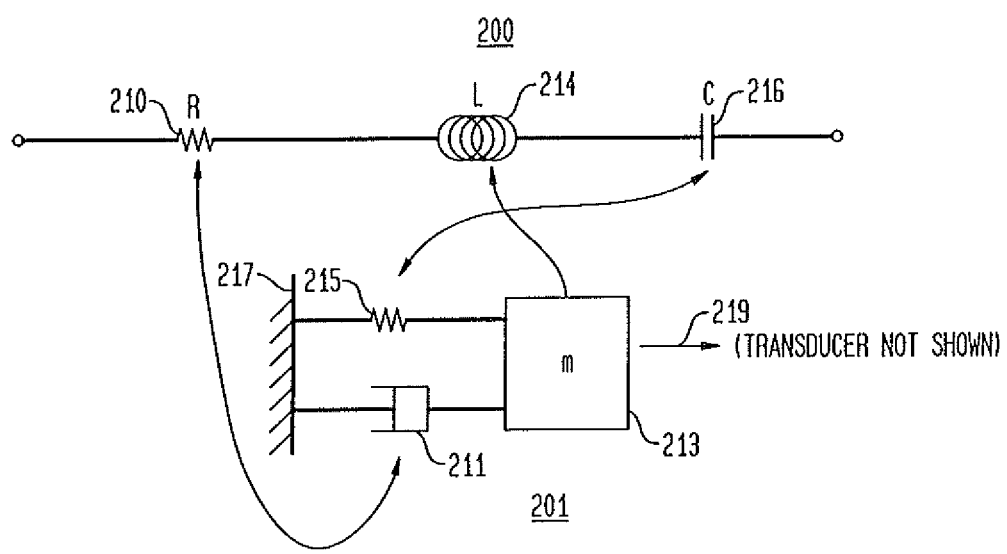
FIG. 2 is a schematic view of a prior art MEMS device.

In one embodiment, the MEMS device or NEMS device is an inertial structure. One example of the model of a mass-spring-damper structure is illustrated in FIG. 2. Such structures are embodied by a cantilever. The model 200 illustrated in FIG. 2 is representative of structures such as 201. The device 201 is manufactured using standard techniques to pattern the structure in the substrate and release the structure therefrom for operation (e.g., etching and deposition techniques such as RF sputtering, CVD, ALD, etc.). As noted above, the model 200 in FIG. 2 represents the structure 201 as an electrical network. In the electrical network representation, the resistor corresponds to the damper 211. A reduction in the attenuation constants of the materials in the inertial device 201 corresponds to a reduction of the value of this resistor 210. This in turn results in an increase of the Q factor of the device 201.

Figure 3A:
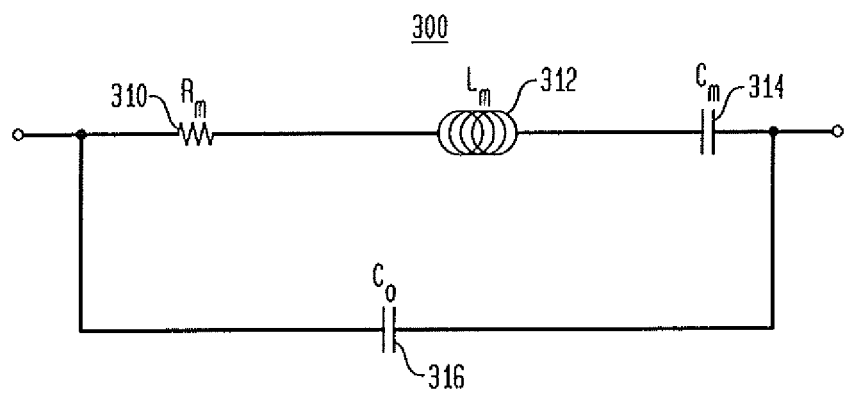
FIG. 3A is a schematic view of a different prior art MEMS device.

One embodiment of an acoustic wave structure is represented by a Butterworth Van-Dyke (BVD) model as illustrated in FIG. 3A. This model 300 captures the electrical behavior of an acoustic wave (e.g. BAW) resonator. For simplicity this model excludes dielectric loss elements such as the one illustrated in FIG. 5. Thus the only loss term in this model 300 is the motion resistance in the motional arm 520 of the BAW resonator device illustrated in FIG. 5. A reduction in the attenuation coefficients of the materials in the BAW device reduces the value of the resistor 310 in this model. This in turn results in an increase in the Q factor for the device.

Figure 3B:
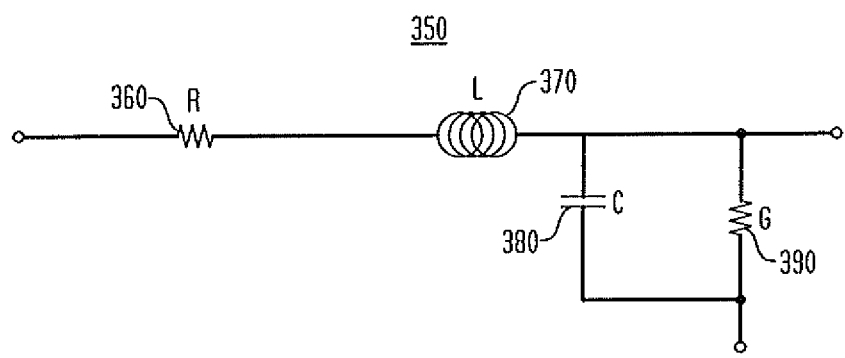
FIG. 3B is a schematic view of a different prior art MEMS device.

The one dimensional mechanical behavior of the acoustic wave structure can also be represented by a 1-D lossy transmission line model as illustrated in FIG. 3B. Several transmission elements from FIG. 3B (i.e., elements 360, 370, 380 and 390), representing each of the material layers in the BAW device (e.g., lower electrode, piezoelectric layer and upper electrode) are formed and connected through their ports as illustrated by FIG. 3B. The mechanical behavioral model is completed by applying appropriate termination impedances to represent the air- or vacuum-break at the electrodes. The loss terms in this transmission line are represented by the series resistance and shunt conductance. As described in van Deventer, J., et al., "PSpice Simulation of Ultrasonic Systems", IEEE Trans. Ultrasonics, Ferroelectrics, and Freq. Cont.", Vol. 47, No. 4, pp. 1014-1024 (July 2000), the disclosure of which are incorporated by reference, the loss terms can be related to the acoustic attenuation coefficient by:

$$R = 2*\rho*v*A*\alpha$$

$$G = 2\alpha/(\rho*v*A) \quad (4)$$

where $\rho$ is the density of each material layer, v is the acoustic velocity in each layer, A is the cross-sectional area, and $\alpha$ is the acoustic attenuation coefficient.

A reduction in the attenuation in the material system results in a reduction in the values of all the resistors in the above models. This reduction is achieved by constructing the devices out of non naturally occurring isotopic materials, preferably using isotopes that are lighter than their naturally occurring counterparts.

Before specific embodiments of the invention are discussed, it is useful to keep in mind the following information about the isotope effect generally. FIG. 1A is a symbol view of an isotope 18 effect. An atom 10 of a particular element consists of a fixed number of protons 14, neutrons 16 and electrons 12. An isotope 18 of an element has a different number of neutrons 16 while keeping the number of protons 14 and electrons 12 unchanged. For example, 12*c* and 13*c* are both isotopes of carbon, with 13*c* having one extra neutron 20 than 12*c*. In the crystal lattice 22, the elemental atoms are present in a natural isotopic composition. The presence of multiple isotopes of an element in the same lattice alters the properties of the lattice.

Referring to FIG. 1B there is provided a plot view of a first-order Raman spectra of diamond of varied isotopic compositions. Six different compositions, designated (a) through (f), are presented. Compositions (a) and (f) are the isotopically pure compositions, with (a) corresponding to nearly pure 12*c* and (f) corresponding to nearly pure 13*c*. Compositions (b) through (e) are isotopically mixed compositions. The left-hand plot of the Raman spectra illustrates that the isotopically pure compositions have smaller line widths. Furthermore, as is illustrated in the right-hand plot of the line width $f_{whm}$, the composition a (nearly pure 12*c*) has a slightly smaller line width than composition (f) (nearly pure 13*c*). This difference in line width is because crystals constructed from lighter isotopes (a) have slightly less anharmonic interactions than those constructed from heavier isotopes (f). As a result compositions (a) and (f) have lower attenuation compared to the other compositions.

FIG. 2 is a schematic view of a mass 213-spring 215-damper 211 MEMS device which is known in the art. This is one example of what is known as MEMS inertial devices (e.g. a cantilever). A mass 213 is connected to a reference ground 217 through a spring 215 and damped by a damper 211. A displacement force 219 (induced by a transducer, not shown) causes the system to move away from its equilibrium. This results in a restoring force acting on the inertial structure 201. If the structure 201 is allowed to return to its equilibrium position (for example, by applying a force that is no longer stronger than the restoring force), the structure oscillates about its equilibrium position. Analogizing to electrical networks, the spring 215 can be viewed as equivalent to a capacitor 216, the mass 213 equivalent to an inductor 214, and the damper 211 equivalent to a resistor 210. The damper 211 (resistor 210 in the electrical network) represents the mechanical loss in the inertial device. For particular structures, it is possible to relate these operational parameters to the geometric parameters of the inertial device.

FIG. 3B is a schematic view of a transmission line element from the prior art. The transmission line is expressed as a delay that is implemented by two network elements: the inductance per unit length 370 and the shunt capacitance per unit length 380. Loss in the line is represented by the resistance per unit length 360 and shunt conductance per unit length 390. In transmission line-based representations of acoustic devices, it is possible to relate geometric and material parameters of the acoustic device to the transmission line parameters.

Figure 4:
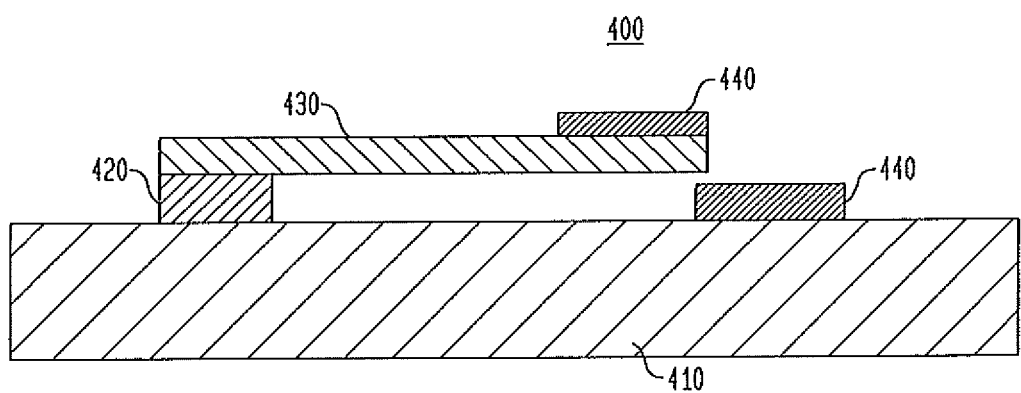
FIG. 4 is a front sectional view of a MEMS inertial cantilever device according to one embodiment of the present invention.

FIG. 4 is a front sectional view of a MEMS inertial cantilever device. The device 400 is illustrated schematically as having a substrate 410, an anchor 420 and cantilever 430. Electrodes 440 are disposed on the substrate 410 and on the cantilever 430. Any of the anchor 420, cantilever 430 or electrodes 440 can be a non-naturally occurring (i.e. refined) istopic material to improve device performance. The released device is supported by the anchor 420 that tethers the device to the substrate 400. The inertial structure 400 is released from the substrate (using the standard process for fabricating MEMS devices (e.g. the MUMPS process well known to those skilled in the art and not described in detail herein). A transducer (not shown) actuates the cantilever from its rest position.

Figure 5:
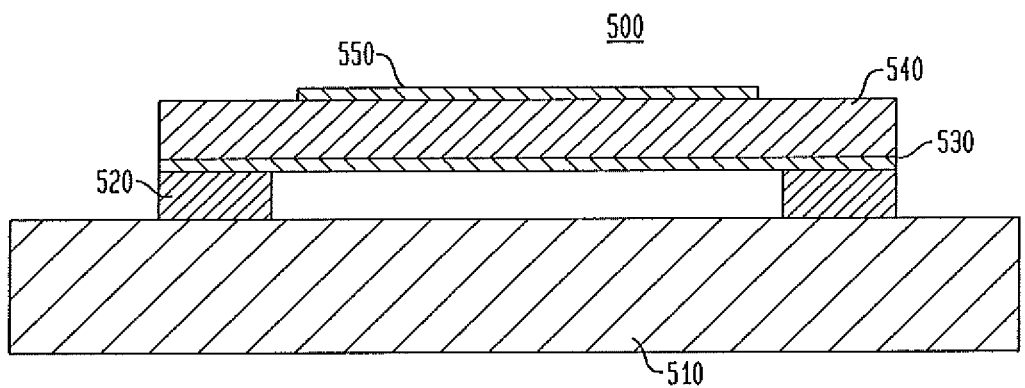
FIG. 5 is a front sectional view of a MEMS bulk acoustic wave resonator device according to one embodiment of the present invention.

FIG. 5 is a front sectional view of a MEMS bulk acoustic wave resonator device. The device shown is in the film bulk acoustic wave resonator (FBAR) configuration, but a similar description applies to other acoustic wave devices such as SMRS and SAWS. The device 500 is supported over the substrate 510 by an anchor 520. The FBAR in its simplest configurations has a lower electrode 530, a piezoelectric layer 540, and an upper electrode 550. Any one or more of the lower electrodes 530, the piezoelectric layer 540 and the upper electrode 550 can be made of a non-naturally occurring isotopic material to improve the quality factor of the device.

Figure 6:
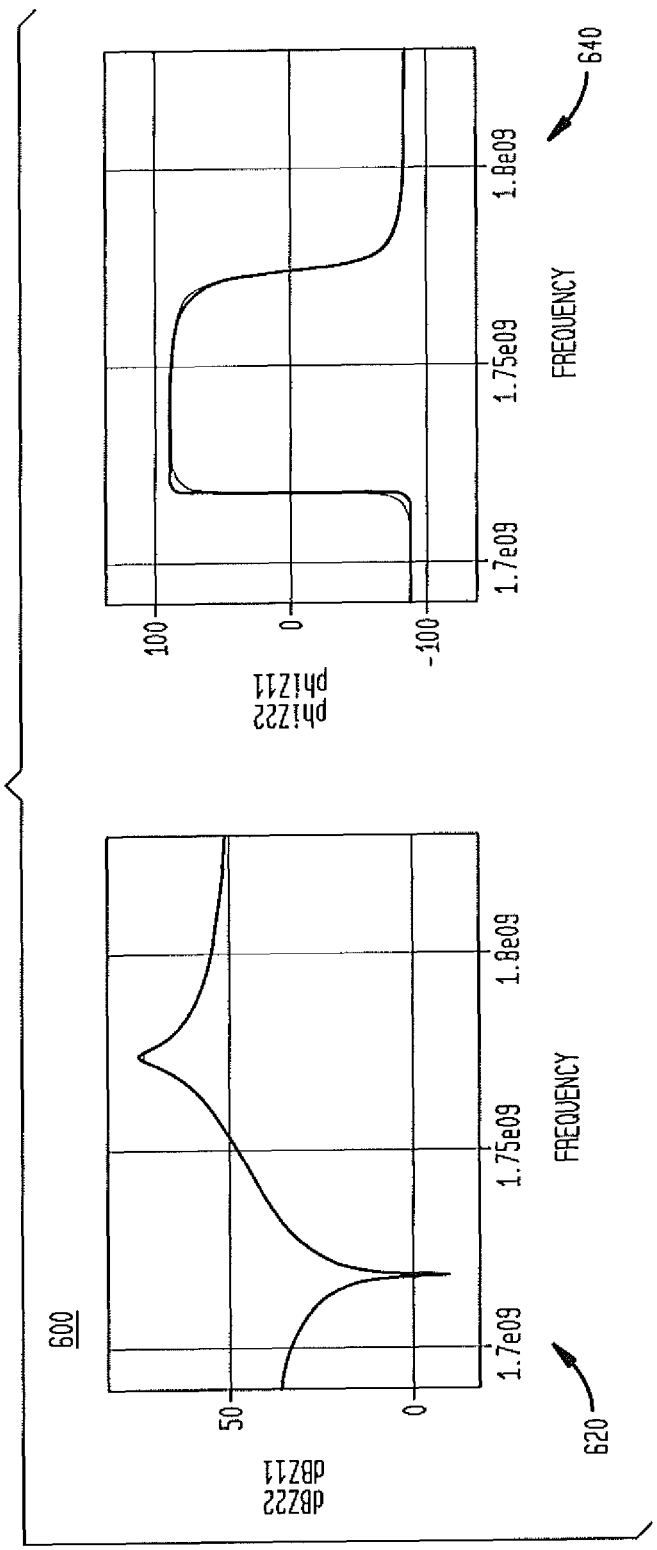
FIG. 6 compares the performance of the BAW resonator of the preset invention with a prior art BAW resonator.

A performance comparison of a BAW resonator in its simplest embodiment (FIG. 5) is presented in FIGS. 6 and 7. The resonator system is an FBAR configuration, with AlN as the piezoelectric material and thin, 0.1 um sputtered iridium top and bottom electrodes. The suspension and substrate are not modeled. The 1-D transmission model (FIG. 3B) is used to represent the physical behavior of the materials. 1.9 um of AlN is used to obtain a series resonance frequency of about 1.72 GHz.

Two examples are described, one with and one without isotopically enriched AlN. No change is made to the electrode material. The isotopic enrichment is represented by a 10× reduction in the line width of equation (3) (compare to about 4× reduction in the Hanzawa et al. result for diamond). For illustrative purposes, no change is assumed in the acoustic velocity 'v' or the k2 of the resonator. However, one skilled in the art will understand that both these properties will also improve as a result of this invention.

The reduction of the linewidth of equation (3) is reflected in a 10× reduction of the attenuation coefficient. This causes a reduction in the transmission line resistors as predicted by equation (4).

FIGS. 6 and 7 illustrate the result of this improvement. As illustrated by these FIGS., there is an approximately 4× improvement in the series quality factor, from about 2000, to about 8000. A smaller improvement is seen in the parallel quality factor. There is no change in k2, as assumed. However, an improvement in k2 is also expected as a beneficial by-product of the use of non-naturally occurring isotopic materials in the device described herein.

FIG. 6 is a simulation result of two BAW resonators in an FBAR configuration. A similar result applies to other acoustic wave devices such as SMRS and SAWS, as well as other MEMS, NEMS and nano devices. In this test, only the piezoelectric material is isotopically enhanced, while the thin electrode is not. The amplitude 620 and phase 640 of the impedance response are shown.

FIG. 7 is an enlarged view of a portion of FIG. 6, with focus on the series resonance frequency. The amplitude 720 and phase 740 of the impedance response are shown. The response of the resonator constructed from naturally occurring materials is 760, while the isotopically enriched resonator response is 780. It is observed that the series quality factor has improved from about 2000 to about 8000, a 4× increase.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

What is claimed:

1. A micro-electro-mechanical system (MEMS) device comprising:
  a transducer ;and
  an insulator defining conductive regions of the device;
  wherein the transducer comprises a piezoelectric material and the conductor and transducer cooperate to provide a device response and wherein at least one of the transducer or the conductor of the MEMS device comprises a non-naturally occurring isotopic material that has been refined to have an altered isotopic dominance such that the dominant isotope of the non-naturally occurring isotopic material is different from the dominant isotope of the naturally occurring form of the isotopic material.

2. A MEMS device of claim 1 wherein the non-naturally occurring isotopic material provides reduced mechanical loss to the MEMS device as compared to a device that does not have the non-naturally occurring isotopic material.

3. A MEMS device of claim 1 wherein the non-naturally occurring isotopic material provides increased breakdown voltage to the MEMS device as compared to a device that does not have the non-naturally occurring isotopic material.

4. A MEMS device of claim 1 wherein the non-naturally occurring isotopic material provides increased tenability to the MEMS device as compared to a device that does not have the non-naturally occurring isotopic material.

5. The MEMS device of claim 1 wherein the piezoelectric material is made of the non-naturally occurring isotopic material.

6. The MEMS device of claim 1 wherein the conductor is an electrode and wherein the conductor is made of the non-naturally occurring isotopic material.

7. The MEMS device of claim 1 wherein the MEMS device comprises an inertial device.

8. The MEMS device of claim 7 wherein the inertial device comprises a spring made of the non-naturally occurring isotopic material.

9. The MEMS device of claim 8 wherein the inertial device comprises a cantilever wherein at least a portion of the cantilever is made of the non-naturally occurring isotopic material.

10. The MEMS device of claim 9 wherein the cantilever has a support anchor and the anchor is made of the non-naturally occurring isotopic material.

11. The MEMS device of claim 1 wherein the MEMS device is a resonator device.

12. The MEMS device of claim 11 wherein the resonator is a thin film resonator supported on a substrate by anchors.

13. The MEMS device of claim 12 wherein the anchors are made of the non-naturally occurring isotopic material.

14. The MEMS device of claim 13 wherein the thin film resonator is formed of a piezoelectric material disposed between two electrodes and wherein the electrodes are made of the non-naturally occurring isotopic material.

* * * * *